United States Patent [19]

Begelfer et al.

[11] Patent Number: 4,915,994
[45] Date of Patent: Apr. 10, 1990

[54] DIMENSIONALLY STABLE PRESSURE SENSITIVE LABEL

[75] Inventors: Larry J. Begelfer, York; Scott L. Hoofnagle, Spring Grove; Paul H. Yeagle, York, all of Pa.

[73] Assignee: York Tape and Label Company, York, Pa.

[21] Appl. No.: 261,676

[22] Filed: Oct. 24, 1988

[51] Int. Cl.⁴ .............................................. B32B 7/06
[52] U.S. Cl. .................................... 428/40; 428/473.5
[58] Field of Search ................. 428/40, 473.5; 283/81; 40/299, 630

[56] References Cited

U.S. PATENT DOCUMENTS 3,854,229 12/1974 Morgan .
4,526,405 7/1985 Hattemer .
4,682,433 7/1987 Stilling .

Primary Examiner—Alexander S. Thomas
Attorney, Agent, or Firm—Samuel M. Learned, Jr.

[57] ABSTRACT

A dimensionally stable pressure sensitive label, and method of making the same, primarily for application upon in-process components in manufacturing operations to provide a reliable bar code identification means and real time data tracking capability of those components when subjected to high temperature processing environments of up to 800-degrees Fahrenheit, which label, following imprint thereon of either or both machine and human readable matter, is thereafter dimensionally reinforced with a high polymer film mechanically bonded to the face stock top-side surface thereof to produce a laminate structure that protects and maintains the printed imagery in a distortion free configuration during utilization in the high temperature processing environment and consistently provides a 100% read rate legibility of the machine readable matter imprinted thereon when sensed with compatable scanning equipment.

5 Claims, 1 Drawing Sheet

DIMENSIONALLY STABLE PRESSURE SENSITIVE LABEL

BACKGROUND OF THE INVENTION

The present invention relates to a dimensionally stable pressure sensitive label structure which provides label stock that is particularly useful in withstanding high temperature use applications, exemplary of which would be as in the circuit board industry where bar code labels are affixed to circuit boards to facilitate identification and real time data tracking during the assembly operations, which in the surface mount and through-hole assembly environments and technologies subject the labels to temperature environments in the 800-degree Fahrenheit area.

Prior to the instant invention, attempts to use conventional laminate structure bar code labels in high temperature processing environments resulted in the label face stock material, upon which the bar code imagry was printed, becoming dimensionally unstable and pliably distorting to the extent that the bar code imprinted thereon became illegible to sensors of compatable scanning equipment and thus the advantageous capabilities for facilitated component identification and real time data tracking of components during processing operations was defeated.

The base laminate structure of the label comprising the instant invention is old and well known in the art, what is new and novel, however, is that following printing and curing of either or both machine and human readable matter upon the unplasticized polyvinyl chloride face stock material component of the base laminate structure, an additional and thermally stable laminate ply comprised of high polymers which have an imide in the polymer chain, which is manufactured and commercially sold by the DuPont Corporation of Wilmington, Del., under the Tradename "Kapton", is mechanically bonded with a suitable interposed adhesive film to the imprint cured unplasticized polyvinyl chloride face stock, which thereby provides the necessary imprinted face stock material stability under use application in high temperature operational environments of up to 800-degrees Fahrenheit and thereby prevents deformation of the imprinted face stock material upon going to a pliable state in high temperature use, or distorting upon cooling, such that imprinted machine readable matter thereon remains 100% legible to compatable scanning equipment sensors before, during, and after use exposure of the dimensionally stable pressure sensitive label structure.

SUMMARY OF THE INVENTION

It is the principal object of the present invention to provide a dimensionally stable pressure sensitive label structure imprinted with either, or both, machine readable code and human readable matter for distortion free utilization in high temperature application and processing environments of up to 800-degrees Fahrenheit.

It is another object of the present invention to provide a method of making the subject dimensionally stable pressure sensitive label structure for utilization in high temperature application and processing environments of up to 800-degrees Fahrenheit.

Yet another object of the present invention is to provide a dimensionally stable pressure sensitive label structure imprinted with machine readable codes for utilization in high temperature applications processing environments while consistently maintaining a 100% read rate legibility of the machine readable code imprinted thereon when sensed with compatable scanning equipment.

A further object of the present invention is to provide a dimensionally stable pressure sensitive label structure for 100% bar code imprint scannable identification and real time data tracking of individual circuit boards during assembly processing transit thereof through either surface mount or through-hole assembly environments and procedures.

An additional object of the present invention is to provide a dimensionally stable pressure sensitive label structure adapted to printably receive machine and human readable matter in single or multi-color imprints by the traditional letterpress fixed font printing method, the computer generated photocomposition process, or the dot matrix impact and/or electrostatic printing processes.

It is also an object of the present invention to provide a dimensionally stable pressure sensitive label structure and method of making the same, utilizing currently available equipment and material respectively without the requirement of effecting any mechanical or chemical changes or modifications thereof.

The foregoing, and other objects hereof, will be readily evident upon a study of the following specification and accompanying drawings comprising a part thereof.

DETAILED DESCRIPTION OF THE INVENTION

Figure 1:
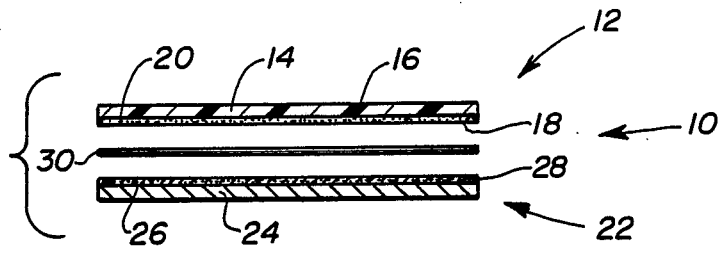
FIG. 1 is a pre-assembly cross sectional view of the various laminated layer components comprising the typical prior art pressure sensitive label structure.

Referring to FIG. 1, the laminate structure components of a typical prior art pressure sensitive label 10 are shown, generally comprised of a face stock component combination 12 usually being a polyvinyl chloride either plasticized or unplasticized or some such other material mechanically functional as a face stock 14 for supportably receiving and retaining upon the upper outward facing surface 16 thereof an inked imprint of machine and human readable matter and to which upon the lower inward facing surface 18 thereof is applied a coating of suitable adhesive bonding primer 20, a carrier liner component combination 22 comprised of a suitable carrier liner backing paper 24 which has applied to the upper inward facing surface 26 thereof a coating of suitable silicone release medium 28 and which in said combination 22 provides protection and support for the label 10 laminate structure during subsequent printing and processing operations such as die-cutting and the like and thereafter prior to actual use application, and an adhesive film 30 which chemically bonds to the face stock component combination 12 by chemical interaction with the adhesive bonding primer 20 and mechanically bonds to the silicone release medium 28 to provide the mechanical application adhesion means for retaining the carrier liner component combination 22 and after peelable removal thereof for affixing the imprinted face stock component combination 12 to a use surface through adhesion by means of retained adhesive film 30 bonded to the lower inward facing surface 18 of said face stock 14 as above described.

Figure 2:
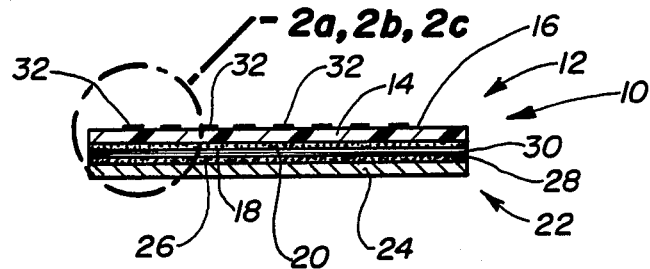
FIG. 2 is an assembled cross sectional view of the typical prior art pressure sensitive label structure shown in FIG. 1 with the additional illustration of both machine and human readable matter imprinted thereon.

The assembled laminate structure composite of the typical prior art pressure sensitive label 10 as illustrated in FIG. 2, which also shows machine and human readable imprint printing 32 applied to the upper outward facing surface 16 of the face stock 14 component thereof. It should be noted that the machine and human readable imprint printing 32 may be applied by the traditional letterpress fixed font printing method wherein the printing technique employed can be that of engraved plate wheels or other types of relief or recessed plates which may utilize various ink systems and ink chemistries, or alternately one of the three processes as diagrammatically illustrated respectively in FIG. 2a through FIG. 2c.

Figure 2A:
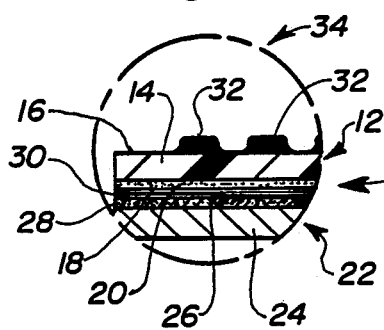
FIG. 2a is an enlarged fragmentary cross sectional view of the encircled portion of the label structure as shown in FIG. 2, illustrating exemplary machine and human readable matter imprint thereon by means of the computer generated photocomposition process.

Although not in any particular order of preferance, the first printing process shown, being that as illustrated in FIG. 2a, represents a diagrammatic rendition of the photocomposition process 34 which is a computer generated photographic method employed to produce both machine and human readable matter 32 by means of a moving beam of light which "paints" machine and human readable characters upon the upper outward facing surface 16 of the face stock 14 that has been previously treated with a photosensitive topcoating.

Figure 2B:
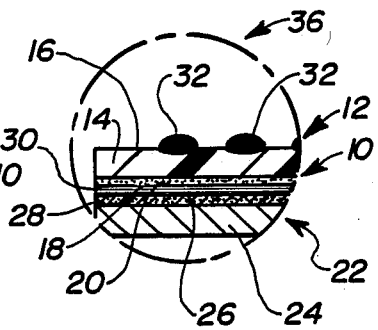
FIG. 2b is an enlarged fragmentary cross sectional view of the encircled portion of the label structure as shown in FIG. 2, illustrating exemplary machine and human readable matter imprint thereon by means of the dot matrix impact process.

Another of the printing methods which may be used is the dot matrix impact process 36 as diagrammatically illustrated in FIG. 2b, and is a mechanical printing process which operates by firing pins or hammers against a ribbon which contacts the face stock 14 to generate both machine and human readable matter 32.

Figure 2C:
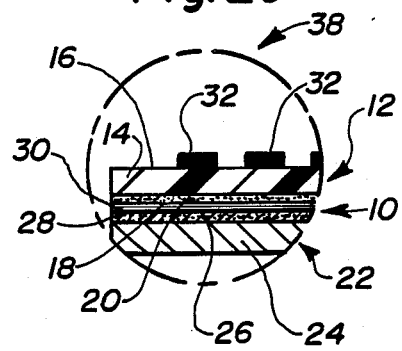
FIG. 2c is an enlarged fragmentary cross sectional view of the encircled portion of the label structure as shown in FIG. 2, illustrating exemplary machine and human readable matter imprint thereon by means of the electrostatic printing process.

The third method used as an imaging process for producing both machine and human readable matter upon the face stock 14 of a typical pressure sensitive label 10 is the electrostatic process 38, as diagrammatically shown in FIG. 2c, wherein the printing technique employed is that of changing the electrostatic composition of the image area on the face stock 14 to receive a dry toner which is then fused to the image area to produce the desired machine and human readable matter 32.

The machinery and methods employed for assembling and printing the typical prior art pressure sensitive label 10 as shown in FIG. 2 series of illustrations are standard items of equipment operated by standard procedures well established and known in the art and are, therefore, not herein further described or discussed.

Figure 3:
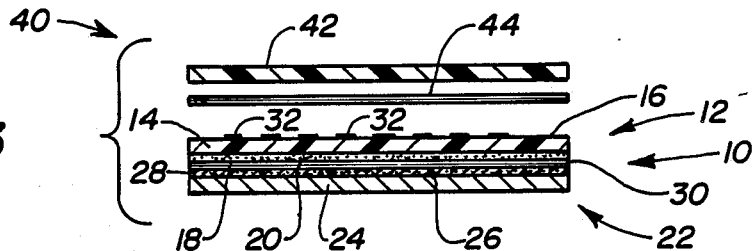
FIG. 3 is a pre-assembly cross sectional view of the various laminated layer components comprising the dimensionally stable pressure sensitive label structure of instant invention.

Referring now to FIG. 3, wherein is illustrated the component combination and relative laminate layering relationships thereof for the dimensionally stable pressure sensitive label 40 of instant invention, which is based upon utilizing the standard structure of a typical prior art pressure sensitive label 10 as above described for the foundation upon which to build the dimensionally stable pressure sensitive label 40 structure in combination therewith, in turn being accomplished by the laminate layered addition of a heat resistant dimensionally stable insulating cover film component 42 laminately bonded to the printed typical prior art pressure sensitive label 10 unplasticized polyvinyl chloride face stock 14 upper outward facing surface 16 by means of a suitable bonding adhesive component 44 as shown in the FIG. 3 exploded view relationship of the various dimensionally stable pressure sensitive label 40 structural components.

Figure 4:
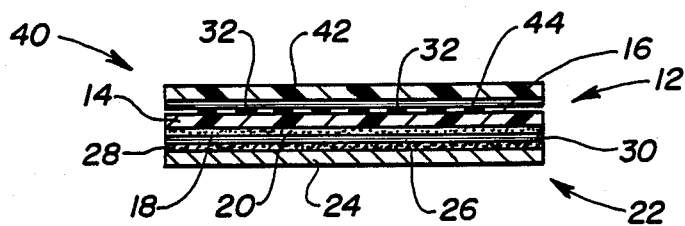
FIG. 4 is an assembled cross sectional view of the dimensionally stable pressure sensitive label structure of instant invention.

Again, the methods and machinery employed for assembling the dimensionally stable pressure sensitive label 40 as illustrated in FIG. 4 are standard procedures carried out on standard items of equipment in manners established and well known in the art and are, therefore, not herein further described or discussed.

The material found most suitable for use application as the heat resistant dimensionally stable insulating cover film component is a film made from high polymers which have an imide group in the polymer chain, a specific example of which is the transparent film material manufactured and sold under the Tradename "Kapton" by DuPont Corporation of Wilmington, Del.

In use application of the dimensionally stable pressure sensitive label 40 as shown in FIG. 4, the standard technique is employed, being that of simply peelably removing the carrier liner backing paper 24 with silicone release medium 28, and applying the label 40 to a clean dry use surface to be adhered thereto by means of the adhesive film 30.

When "Kapton" or any similar high polymer which has an imide group in the polymer chain is employed as the heat resistant dimensionally stable insulating cover film component 42, it being dimensionally and structurally stable in temperature and use environments of up to 800-degrees Fahrenheit, then the laminate structure of the label 40 is likewise rendered dimensionally and structurally stable in temperature use environments of up to 800-degrees Fahrenheit, and even though the unplasticized polyvinyl chloride face stock 14 material may melt, because of the laminate structural support afforded to it by the heat resistant dimensionally stable insulating cover film component 42, the machine and human readable imprint printing upon the face stock 14 will not distort at use temperatures up to 800-degrees Fahrenheit, and in particular under such temperature conditions the machine readable imprint will retain a 100% read rate legibility when sensed with compatable scanning equipment. The foregoing high temperature characteristics of the dimensionally stable pressure sensitive label 40 make it particularly suitable for bar code identification and real time data tracking use applications upon in-process components subjected to a high temperature processing environment, such as would be the cases when dealing with individual electronic components soldered by either the surface mount or through-hole technologies.

Although the invention has been herein shown and described in what is conceived to be the most practical and preferred embodiment, it is recognized that departures may be made therefrom within the scope of the invention, which is not to be limited to the details disclosed herein but is to be accorded the full scope of the claims so as to embrace any and all equivalent high temperature use application dimensionally stable pressure sensitive label structures and methods of making the same.

We claim:

1. A dimensionally stable pressure sensitive label for distortion free utilization upon support surfaces in high temperature application environments of up to 800-degrees Fahrenheit, comprising in combination a face stock material having applied to the lower inward facing surface thereof an adhesive bonding primer and imprinted upon the upper outward facing surface thereof a printing of machine and human readable matter, a carrier lining backing paper having applied thereto a silicone release medium, an adhesive film laminately bonding the lower inward facing surface of said face stock material to said silicone release medium to form a pressure sensitive laminate label structure, and a heat resistant dimensionally stable insulating cover film component comprised of a high polymer having an imide group in the polymer chain being laminately bonded to the upper outward facing surface of said face stock material upon said printing by means of a bonding adhesive component to thereby form said dimensionally stable pressure sensitive label.

2. The dimensionally stable pressure sensitive label according to claim 1 wherein said face stock material is unplasticized polyvinyl chloride.

3. The dimensionally stable pressure sensitive label according to claim 2 wherein said printing of machine and human readable matter is accomplished by a photocomposition process.

4. The dimensionally stable pressure sensitive label according to claim 2 wherein said printing of machine and human readable matter is accomplished by a dot matrix impact process.

5. The dimensionally stable pressure sensitive label according to claim 2 wherein said printing of machine and human readable matter is accomplished by an electrostatic process.

* * * * *